United States Patent
Agrawal et al.

(10) Patent No.: US 6,928,598 B1
(45) Date of Patent: Aug. 9, 2005

(54) SCAN METHOD FOR BUILT-IN-SELF-REPAIR (BISR)

(75) Inventors: Ghasi R. Agrawal, San Jose, CA (US); Mukesh K. Puri, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 572 days.

(21) Appl. No.: 09/880,675

(22) Filed: Jun. 13, 2001

(51) Int. Cl.[7] .............................................. G01R 31/28
(52) U.S. Cl. ...................................................... 714/726
(58) Field of Search ................................ 714/726, 727, 714/729, 733, 734, 718

(56) References Cited

U.S. PATENT DOCUMENTS 6,067,262 A * 5/2000 Irrinki et al. ................ 365/201
6,212,656 B1 * 4/2001 Fosco et al. ................. 714/726
6,408,414 B1 * 6/2002 Hatada ........................ 714/727

* cited by examiner

Primary Examiner—Guy J. Lamarre
Assistant Examiner—James C. Kerveros
(74) Attorney, Agent, or Firm—Suiter West PC LLO

(57) ABSTRACT

A system and method for protecting the values stored in a BISR repair block and, optionally, debugging the BISR repair logic without altering normal test flow is implemented by a circuit including a plurality of soft latches within the BISR repair block, the soft latches being coupled together to form a BISR scan chain for holding BISR repair information. A chip level scan enable signal and a scan hold control signal cooperate to control connection of the BISR scan chain to other scan chains during a scan test, so that the BSR repair information is held within the soft latches. A diagnose enable signal cooperating with the chip level scan enable signal and the scan hold control signal for enabling debugging of logic connecting the BISR scan chains.

30 Claims, 4 Drawing Sheets

US 6,928,598 B1

SCAN METHOD FOR BUILT-IN-SELF-REPAIR (BISR)

FIELD OF THE INVENTION

The present invention relates generally to Built-In-Self-Repair (BISR) techniques utilized for testing and repair of the memory arrays of Intelligent Random Access Memories (IRAM), Dynamic Random Access Memories (DRAM) and the like, and more specifically to a system and method for protecting the values stored in a BISR repair block and debugging the BISR repair logic without altering normal test flow.

BACKGROUND OF THE INVENTION

Built-In-Self-Repair (BISR) techniques are increasingly being used to test and repair the memory arrays of Intelligent Random Access Memories (IRAM), Dynamic Random Access Memories (DRAM), and the like. BISR utilizes on-chip circuitry for automatically testing the memory array, and optionally performing a soft-repair of failed elements (rows, columns, I/Os, etc.) of the memory array discovered during test.

BISR stores the repair solution (i.e., the addresses of defective elements and the addresses of redundant elements of the memory array to which the defective elements have been remapped) in soft latches at least during the initial check of the memory. Once the initial check is complete, the user may scan out the information from these soft latches for blowing the fuses of defective row or column elements of the array, or, optionally, for programming the chip so that these elements are not accessed. This initial check does not destroy the repair solution because by design, the same solution is fed back from the output. If a soft BISR methodology is utilized (e.g., BISR is run in the field and the repair solution is evaluated at each power-up of the memory), the repair solution is not scanned. Instead, a soft-repair of failed elements of the memory array is performed, if possible. However, in both the cases, during the production test flow, BISR is run under various conditions (e.g., under various temperature and voltages) to assure good repair solution in all conditions.

Many types of testing are performed in the production test flow of a memory. One such test is chip-level scan (SCAN). The SCAN test is also generally slow to run, and is thus somewhat expensive. As a result, this test is normally placed somewhere in the middle of the test flow so that the overall production test flow is optimized. Further, during the SCAN test, soft latches used by the BISR are connected in the scan-chain causing the repair solution stored in the soft latches to be lost. Consequently, a custom test flow is generally used for memory designs employing BISR, wherein the SCAN test is done either at the start of the test flow or after the BISR SCAN of the test flow is complete, after which values stored in soft latches are no longer needed. However, if a custom test flow is used, the user must maintain two test flows, one for normal designs which do not use BISR, and one for designs which use BISR resulting in increased cost for testing. Moreover, since the custom test flow is not optimized, additional cost is incurred due to inefficiency in the test flow, even though the designs employ BISR.

SUMMARY OF THE INVENTION

Accordingly, the present invention is directed to a system and method for protecting the values stored in a BISR repair block and, optionally, debugging the BISR repair logic without altering normal test flow.

In an exemplary embodiment, the system and method of the present invention is implemented by a circuit comprising a plurality of soft latches within the BISR repair block, the soft latches being coupled together to form a BISR scan chain for holding BISR repair information. A chip level scan enable signal for enabling a scan test and a scan hold control signal for controlling holding of the repair information in the soft latches of the BISR scan chain is provided to the circuit. The chip level scan enable signal and the scan hold control signal cooperate to control connection of the BISR scan chain to other scan chains during a scan test, so that the BISR repair information is held within the soft latches. A diagnose enable signal may likewise be provided. The diagnose enable signal cooperating with the chip level scan enable signal and the scan hold control signal for enabling debugging of logic connecting the BISR scan chains.

It is to be understood that both the foregoing general description and the following detailed description are exemplary and explanatory only and are not restrictive of the invention as claimed. The accompanying drawings, which are incorporated in and constitute a part of the specification, illustrate presently preferred embodiments of the invention, and together with the general description given above and the detailed description of the preferred embodiments given below, serve to explain the principles of the invention.

BRIEF DESCRIPTION OF THE DRAWINGS

The detailed description of the invention may be best understood when read in reference to the accompanying drawings wherein.

DETAILED DESCRIPTION OF THE INVENTION

Reference will now be made in detail to the presently preferred embodiments of the invention, an examples of which are illustrated in the accompanying drawings.

Figure 1:
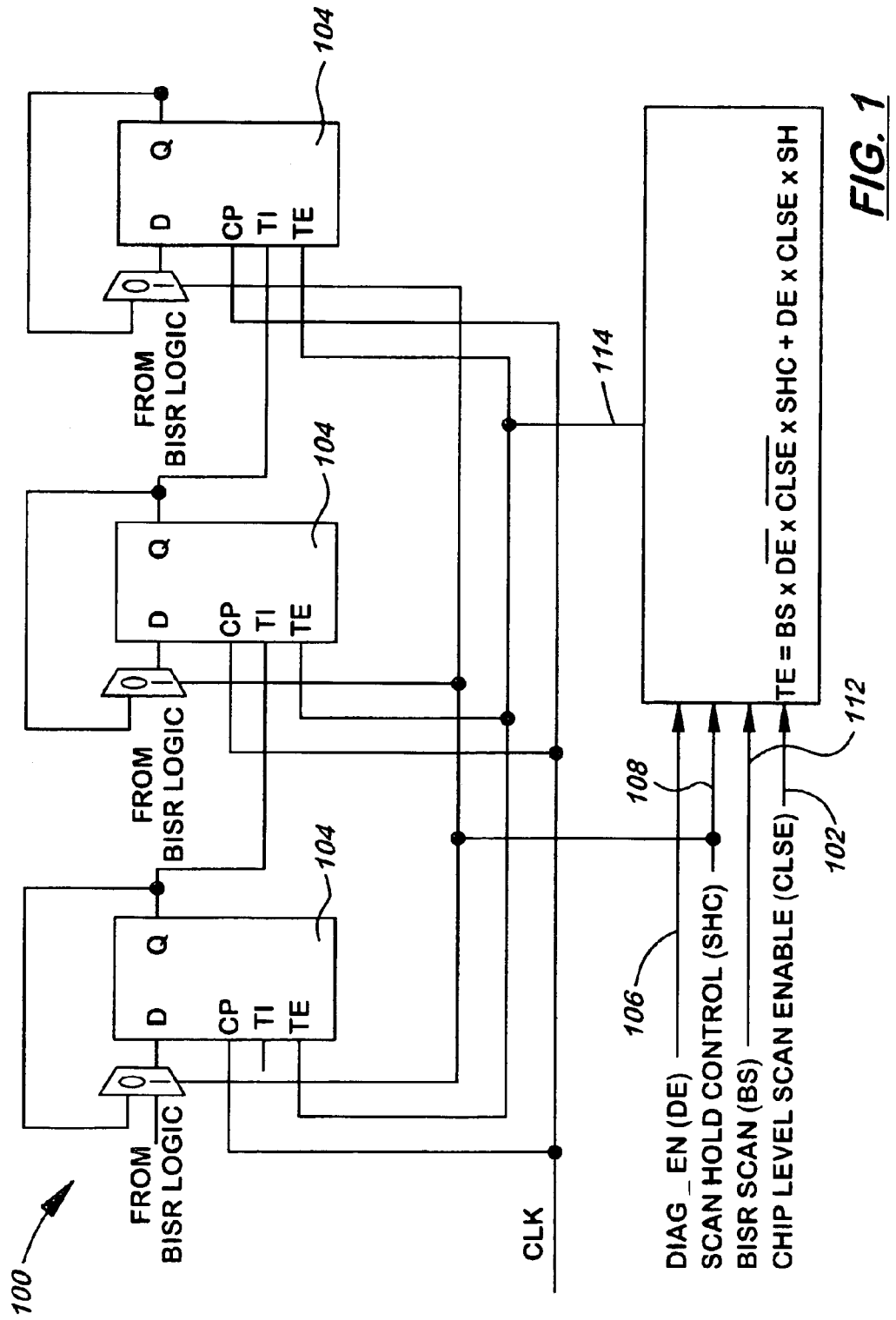
FIG. 1 is a circuit diagram illustrating a BISR scan chain circuit providing BISR SCAN hook-ups in accordance with an exemplary embodiment of the present invention.

FIG. 1 illustrates a circuit 100 for providing BISR chip-level scan (SCAN) test hook-ups in accordance with an exemplary embodiment of the present invention. When a SCAN test at the chip-level is performed, a designated pin becomes high (i.e., is assigned logic value "1") when chip-level shifting (in SCAN) is performed and low (i.e., is assigned logic value "0") during capture mode. In the exemplary circuit illustrated in FIG. 1, this pin is designated "CHIP-LEVEL SCAN ENABLE" (CLSE) 102. In accordance with the present invention, the soft latches 104 inside the BISR repair block are not connected to other scan chains at the chip-level. Instead, as shown in FIG. 1, the soft latches 104 are connected in a separate scan chain via circuit 100. In exemplary embodiments, soft latches are comprised of volatile memory latches such as flip flops or the like.

As shown in FIG. 1, a second pin "DIAGNOSE ENABLE" or "DIAG_EN" (DE) 106 is provided at the chip level. In exemplary embodiments, DIAG_EN pin 106 may be an added pin, a shared existing pin, or may be controlled through a TAP (Test Access Port) controller, or the like. Further, since much of the SCAN test is controlled through the TAP controller, a third signal may be generated from the TAP controller for holding data in soft latches 104 when the chip-level SCAN is being run (e.g., SCAN test is either shifting or capturing data). In FIG. 1, this signal is provided by the "SCAN HOLD CONTROL" (SHC) pin 108. In the exemplary embodiment shown, when the SCAN HOLD CONTROL (SHC) pin 108 is low (i.e.,"0"), data is held in the BISR SCAN soft latches 104. The basic BISR functionality is controlled by the signal of pin "BISR SCAN" (BS) 112, which is generated based on BISR inputs. In the embodiment shown, when BISR SCAN mode is selected, the "BISR SCAN" (BS) signal 112 is high (i.e., "1"), otherwise it remains low (i.e., "0 ). The basic functions caused to be implemented by the CHIP-LEVEL SCAN ENABLE (CLSE) pin 102, DIAG_EN pin 106, SCAN HOLD CONTROL (SHC) pin 108, and BISR SCAN (BS) 112 pins are shown in TABLE. 1.

TABLE 1

| BS | DE | CLSE | SHC | TE | COMMENT |
|---|---|---|---|---|---|
| X | 0 | 0 | 0 | 0 | SCAN Mode: Since DE is low the data is held and no SCAN is performed |
| X | 0 | 1 | 0 | 0 | SCAN Mode: Since DE is low the data is held and no SCAN is performed |
| X | 1 | 0 | 1 | 0 | Debug SCAN: Capture the data |
| X | 1 | 1 | 1 | 1 | Debug SCAN: SCANing the data |
| 0 | 0 | 0 | 1 | 0 | BISR Mode: Capture the data |
| 1 | 0 | 0 | 1 | 1 | BISR Mode: Scan the data |

The signal provided by the pin "TEST ENABLE" (TE) 114 to soft latches 104 in the BISR scan chain circuit 100 is a function of the signals of the CHIP-LEVEL SCAN ENABLE (CLSE) pin 102, DIAG_EN pin 106, SCAN HOLD CONTROL (SHC) pin 108, and BISR SCAN (BS) 112 pin. In the embodiment shown, the logical value of the signal provided by the pin "TEST ENABLE" (TE) 114 may be determined by the following expression:

$$TE = BS \cdot DE \cdot CLSE \cdot \overline{SHC} + DE \cdot CLSE \cdot \overline{SHC}$$

TABLE 2 illustrates the cardinal (k) map for the "TEST ENABLE" (TE) pins shown in FIG 1.

TABLE 2

| CLSE SHC<br>BS DE | 01 | 00 | 11 | 10 |
|---|---|---|---|---|
| 00 | 0 | 0 | *0* | 0 |
| 01 | 0 | *0* | 1 | *0* |
| 10 | 1 | 0 | *0* | 0 |
| 11 | 0 | *0* | 1 | *0* |

It is desirable that the signal provided by TEST ENABLE (TE) pin 114 is never low (i.e., "0") whenever the CHIP-LEVEL SCAN ENABLE (CLSE) pin 102 and SCAN HOLD CONTROL (SHC) pin 108 are both high (i.e., "1"), and either the BISR SCAN (BS) 112 pin and DIAG_EN pin 106 are both low (i.e., "0") or else the BISR SCAN (BS) 112 pin is high (i.e., "1") and the DIAG_EN pin 106 is low (i.e.,"0"). These conditions are indicated in TABLE 2 by bolded blocks. However, referring to TABLE 1, it can be seen that the TEST ENABLE (TE) pin 114 will not normally be low under these conditions. Further, as indicated by TABLE 1, the TEST ENABLE (TE) pin 114 will not normally be low (i.e.,"0") when the CHIP-LEVEL SCAN ENABLE (CLSE) pin 102 is low (i.e., "0"), the SCAN HOLD CONTROL (SHC) pin 108 is low (i.e., "0"), the BISR SCAN (BS) 112 pin is low (i.e., "0"), and DIAG_EN pin 106 is high (i.e., "1"), when the CHIP-LEVEL SCAN ENABLE (CLSE) pin 102 is high (i.e.,"1"), the SCAN HOLD CONTROL (SHC) pin 108 is low (i.e., "0"), the BISR SCAN (BS) 112 pin is low (i.e., "0"), DIAG_EN pin 106 is high (i.e., "1"), when the CHIP-LEVEL SCAN ENABLE (CLSE) pin 102 is low (i.e., "0"), the SCAN HOLD CONTROL (SHC) pin 108 is low (i.e.,"0"), the BISR SCAN (BS) 112 pin is high (i.e., "1"), and DIAG_EN pin 106 is high (i.e., "1"), and when the CHIP-LEVEL SCAN ENABLE (CLSE) pin 102 in high (i.e., "1"), the SCAN HOLD CONTROL (SHC) pin 108 is low (i.e., "0"), the BISR SCAN (BS) 112 pin is high (i.e., "1"), and DIAG_EN pin 106 is high (i.e., "1") as indicated by italicized zeros ("0") in TABLE 2, since these conditions are also not normally encountered. However, even if any of the conditions are encountered, they are safe because the repair data is being held in the soft latches 104 and no SCAN test is being performed due to the signal provided by the SCAN HOLD CONTROL (SHC) pin 108 being low (i.e., "0").

During normal chip-level SCAN testing, the signal provided by the DIAG_EN (DE) pin 106 is kept low (i.e., "0") and the signal provided by the CHIP-LEVEL SCAN ENABLE (CLSE) pin 102 is kept high (i.e., "1") for shifting and low (i.e., "0") for capturing. Further, the signal provided by the SCAN HOLD CONTROL (SHC) pin 108 from the TAP controller is kept low (i.e., "0"). This is accomplished readily since the TAP controller is driven by input patterns during chip level SCAN. Since the signal provided by the DIAG_EN (DE) pin 106 is low (i.e., "0") and the signal provided by the SCAN HOLD CONTROL (SHC) pin 108 is also low (i.e., "0"), data is held in the BISR SCAN soft latches 104 irrespective of the signal provided by the BISR SCAN (BS) 112 pin. In this manner, all chip-level SCAN chains are run and the rest of the logic is tested without destroying the repair solution stored inside these latches.

Normally, Built-In-Self-Repair (BISR) circuitry is capable of detecting relevant faults in the isolated memory circuitry. If a fault is detected in the isolated memory circuitry since the SCAN chain associated with the BISR repair logic is not yet tested, the signal provided by the DIAG_EN (DE) pin 106 is forced high ("1") causing the chain to function is SCAN mode. In this manner, the BISR repair logic may also be debugged if necessary. However, during a general production test flow, this debug facility is not required. Hence, no modification in the normal test flow in necessary. When the signal provided by the DIAG_EN (DE) pin 106 is high (i.e., logic value of "1"), e.g., when the circuit is in debug SCAN mode, the signal provided by the SCAN HOLD CONTROL (SHC) pin 108 is kept high (i.e., logic value of "1") so that the value of the signal provided by the the TEST ENABLE (TE) pin 114 can be controlled as required.

Figure 2:
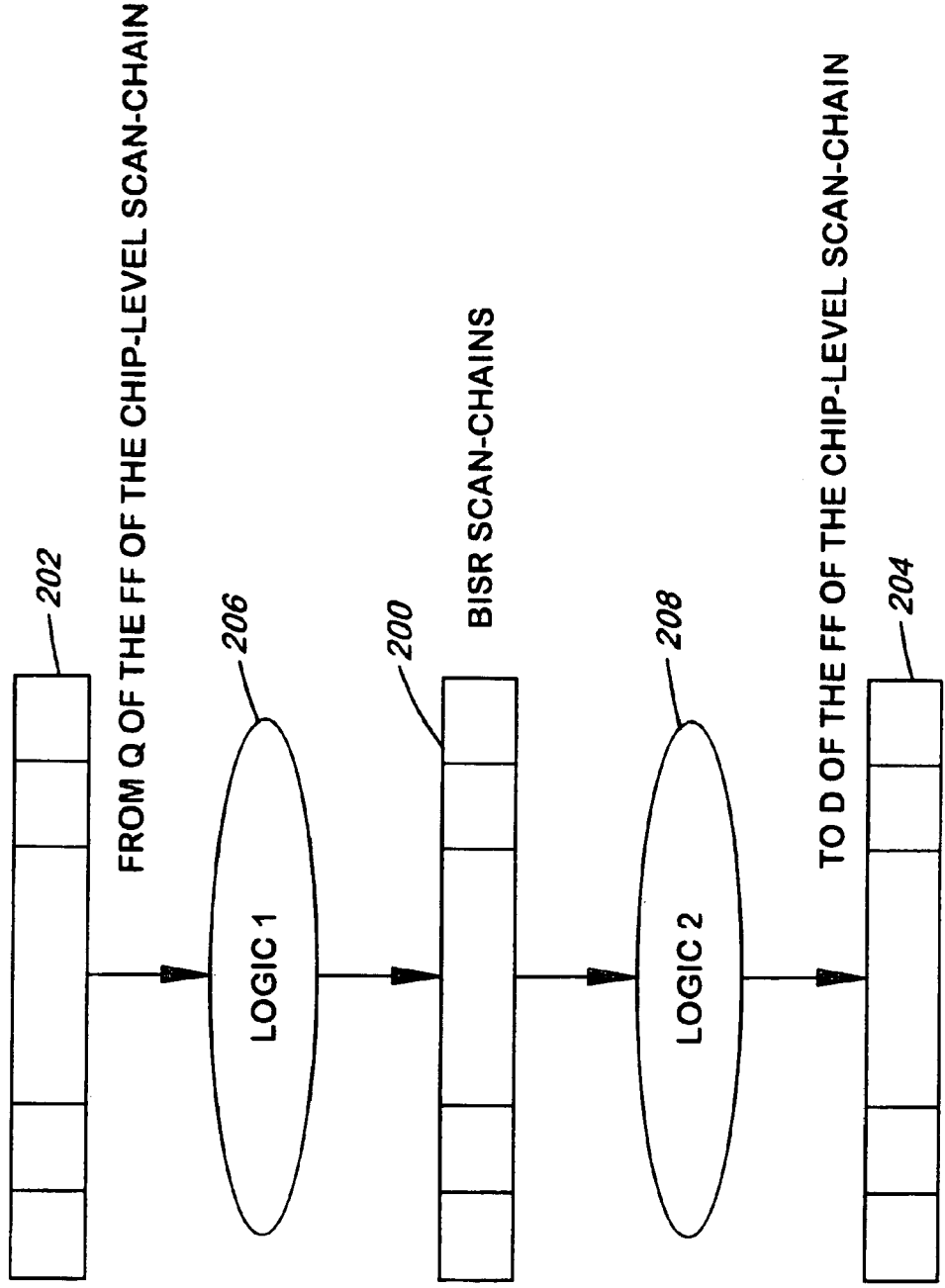
FIG. 2 is a block diagram illustrating the BISR scan chain in relation to other scan chains within the memory.

Referring now to FIG. 2, the BISR scan chain 200 and its relationship with respect to other SCAN CHAINS 202 & 204 is described. If no debug SCAN mode is provided, so me logic (e.g., "LOGIC 1" 206 and "LOGIC 2" 208) may not be testable through the SCAN test since the BISR scan chain 200 is not used during chip-level SCAN. During the debug SCAN mode it is desirable that the BISR scan chain is part of the normal SCAN so that the logic (e.g., "LOGIC 1" 206 and "LOGIC 2" 208) may be tested. Accordingly, it is desirable that the BISR scan chain be connected at the chip level.

Figure 3:
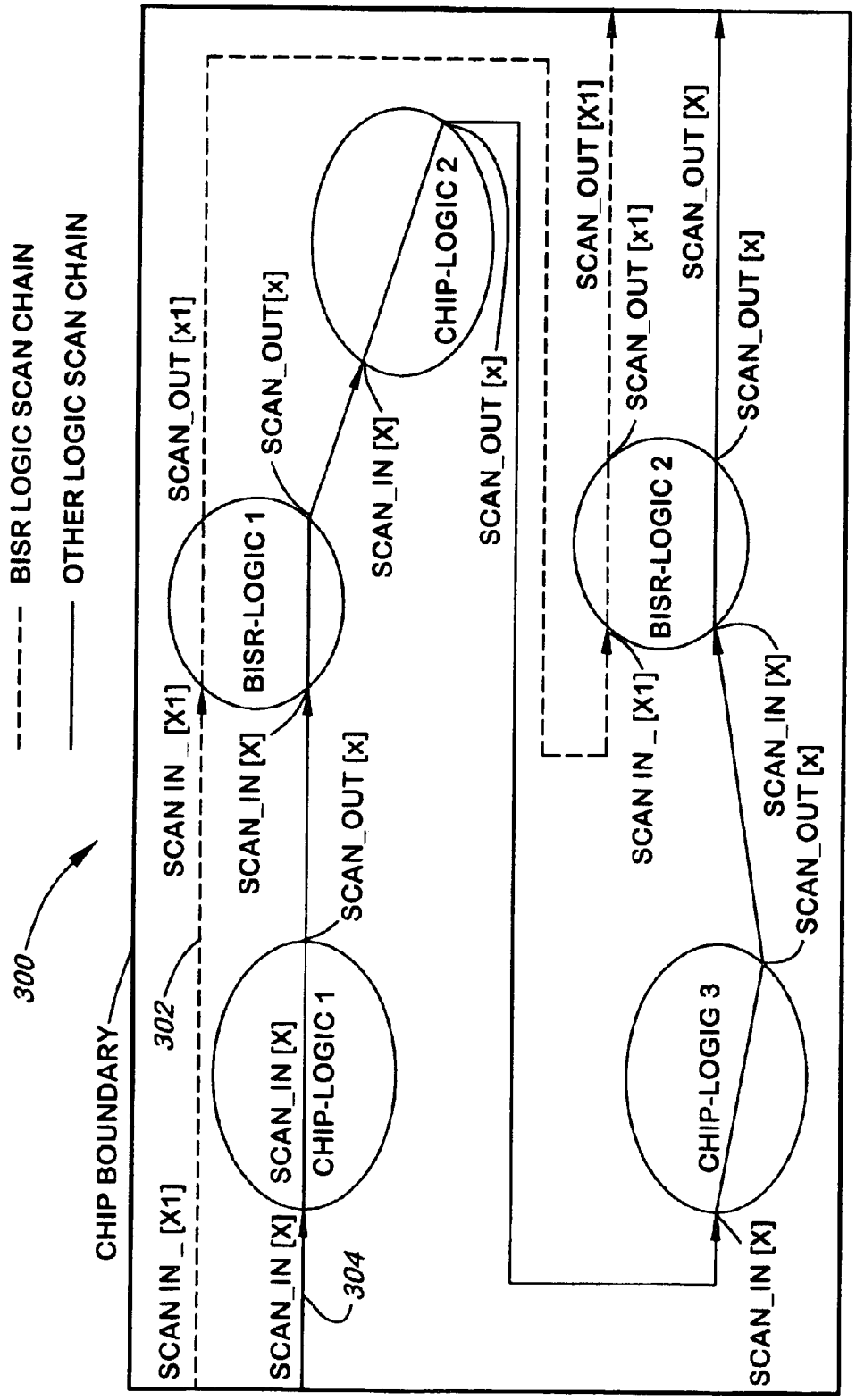
FIG. 3 is a block diagram illustrating chip level hook-up of the BISR scan chain in accordance with an exemplary embodiment of the present invention.
Figure 4:
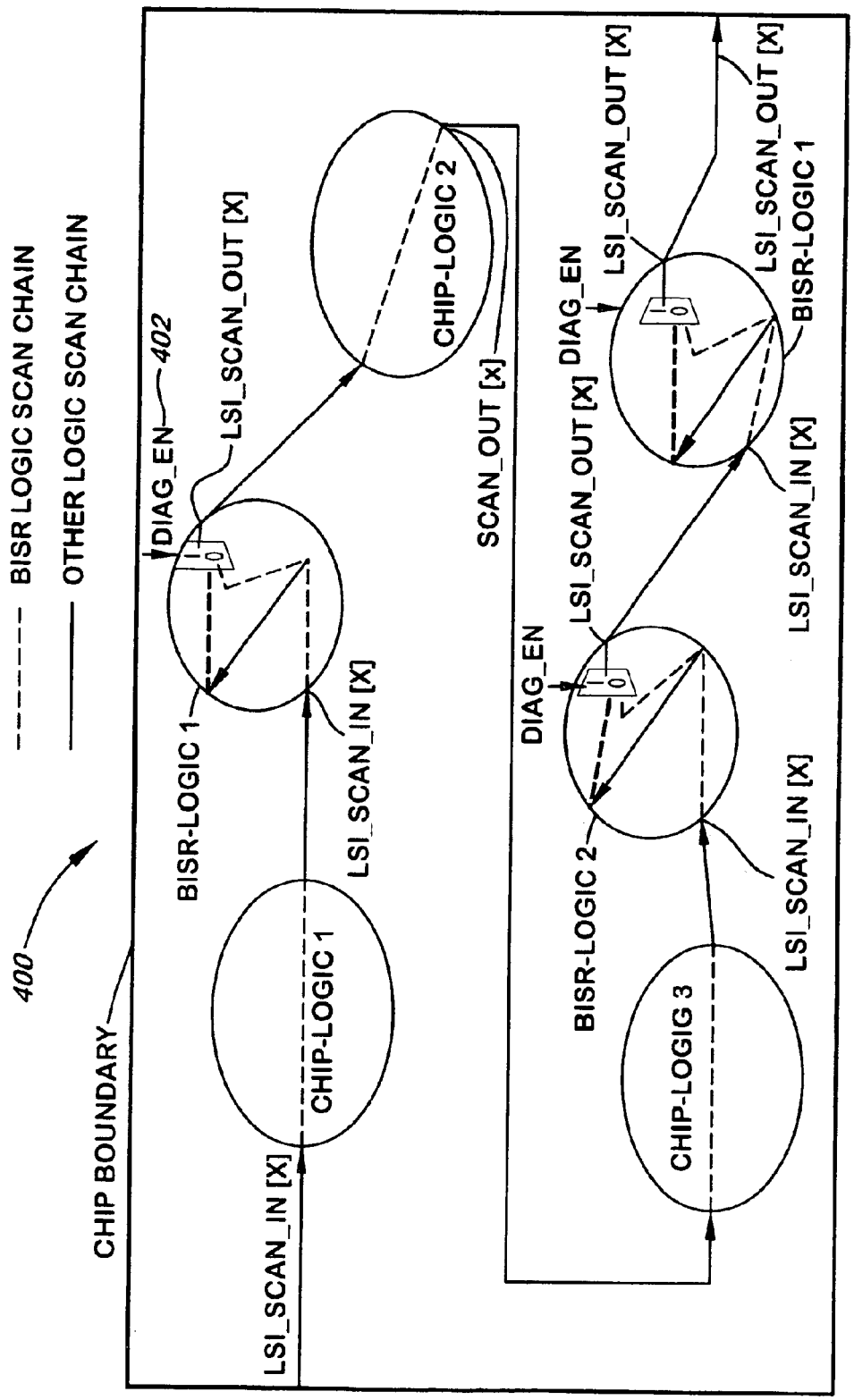
FIG. 4 is a block diagram illustrating chip level hook-up of the BISR scan chain in accordance with a second exemplary embodiment of the present invention.

Referring now to FIGS. 3 and 4, exemplary methods 300 & 400 for connecting the BISR scan chain at the chip-level are illustrated. As shown in FIG. 3, the BISR scan chains in the chip may be connected in a single scan chain (e.g., SCAN[X1] 302) which may be activated when required. The remainder of the logic (including any soft latches in the BISR logic which are not part of the BISR scan chain) form other scan chains (e.g., SCAN-CHAIN[X] 304). Only one other scan chain (SCAN-CHAIN[X] 304) is illustrated in FIG. 3. However, it will be appreciated that depending on the chip-level logic, additional scan chains may be provided.

Alternately, as shown FIG. 4, the BISR scan chain, may itself be multiplexed with the normal scan chain. Thus, when in normal chip-level SCAN mode, the BISR scan chain may be bypassed. However, during debug SCAN mode, the BISR scan chain is placed back in the scan chain path. In the exemplary embodiment shown, this is accomplished by using the DIAG_EN (DE) signal 402. When the DIAG_EN (DE) signal 402 is low (i.e., "0") the BISR scan chain is bypassed by the chip-level SCAN. However, when the DIAG_EN (DE) signal 402 is high (i.e., "1"), the multiplexer input is selected in such way that the BISR scan chain is put in the SCAN path.

Accordingly, there has been described a system and method for protecting the values stored in a BISR repair block and, optionally, debugging the BISR repair logic without altering normal test flow. In this manner, substantial memory may be saved. While the present invention has been described in the context of BISR system, it will be appreciated that the present system and method may be utilized in other contexts such as Built-In-Self-Test (BIST), or the like for optimizing the production test flow. Further, it will be appreciated that the circuit 100 shown in FIG. 1 for implementing the present invention is exemplary and not exhaustive of all circuits possible. According, it is believed that modification of the circuit by those of ordinary skill in the art while retaining the any or all of the functions provided by the present invention would not depart from the scope and spirit of the present invention as defined in the appended claims.

It is believed that the present invention and many of its attendant advantages will be understood by the forgoing description, and it will be apparent that various changes may be made in the form, construction and arrangement of the components thereof without departing from the scope and spirit of the invention or with out sacrificing all of its material advantages, the form herein before described being merely an explanatory embodiment thereof. It is the intention of the following claims to encompass and include such changes.

What is claimed is:

1. A circuit for protecting the values stored in a BISR repair block in an integrated circuit having a custom test flow, comprising:
   a plurality of soft latches within the BISR repair block, the soft latches being coupled together to form a BISR scan chain for holding BISR repair information;
   means for providing a chip level enable scan signal for enabling a scan test, and a scan hold control signal for controlling holding of the repair information in the soft latches of the BISR scan chain,
   wherein the chip level scan enable signal and the scan hold control signal cooperate to control connection of the BISR scan chain to other scan chains during a scan test, so that the BISR repair information is held within the soft latches and said scan test is any part of said custom test flow employing a BISR circuit;
   means for providing a BISR scan signal suitable for causing the scan test to be run;
   means for providing a diagnose enable signal, the diagnose enable signal cooperating with the chip level can enable signal and the scan hold control signal for enabling debugging of logic connecting the BISR scan chains; and
   means for receiving the chip level scan enable signal, the scan hold control signal, the BISR scan signal and the diagnose enable signal and providing a test enable signal and providing test enable signal determined by the expression $$TE=BS \cdot DE \cdot CLSE \cdot SHC+DE \cdot CLSE \cdot SHC$$

wherein TE is the test enable signal, BS is the BISR scan signal, DE is the diagnose enable signal, CLSE is the chip level scan enable signal, and SHC is the scan hold control signal.

2. The circuit as claimed in claim 1, wherein the chip level scan enable signal and the scan hold control signal cooperate to prevent the BISR scan chain from being connected to other scan chains.

3. The circuit as claimed in claim 1, wherein the chip level scan enable signal, the scan hold control signal, the diagnose enable signal and the BISR scan signal are combined to provide a test enable signal for controlling connection of the BISR scan chain to other scan chains during a scan test.

4. The circuit as claimed in claim 1, wherein the BISR scan chain is connected in a single scan chain separate from logic forming other scan chains, and wherein the BISR scan chain is activated when required.

5. The circuit as claimed in claim 1, wherein the BISR scan chain is multiplexed with a normal scan chain.

6. The circuit as claimed in claim 5, wherein when the diagnose enable signal is low the BISR scan chain is bypassed by the scan test and wherein when the diagnose enable signal is high, the BISR scan chain is put in the scan test path.

7. A method for protecting the values stored in a BISR repair block in an integrated circuit having a custom test flow, comprising:
   storing repair information in a plurality of soft latches within the BISR repair block, the soft latches being coupled together to form a BISR scan chain for holding the BISR repair information;
   providing a chip level scan enable signal for enabling a scan test and a scan hold control signal for controlling holding of the repair information in the soft latches of the BISR scan chain,
   wherein the chip level scan enable signal and the scan hold control signal cooperate to control connection of the BISR scan chain to other scan chains during a scan test, so that the BISR repair information is held within the soft latches and said scan test is any part of said custom test flow employing BISR circuit;
   providing a BISR scan signal suitable for causing the scan test to be run;
   providing a diagnose enable signal, the diagnose enable signal cooperating with the chip level scan enable signal and the scan hold control signal for enabling debugging of logic connecting the BISR scan chains;

receiving the chip level scan enable signal, the scan hold control signal, the BISR scan signal and the diagnose enable signal; and providing a test enable signal, wherein the chip level scan enable signal, the scan hold control signal, the diagnose enable signal and the BISR scan signal are combined to provide the test enable signal for controlling connection of the BISR scan chain to other scan chains during a scan test.

8. The method as claimed in claim 7, wherein the chip level scan enable signal and the scan hold control signal cooperate to prevent the BISR scan chain from being connected to other scan chains.

9. The method as claimed in claim 7, wherein the test enable signal is determined by the expression

TE=BS×DE×CLSE.×SHC=DE×CLSE.×SHC wherein TE is the test enable signal, BS is the BISR scan signal, DE is the diagnose enable signal, CLSE is the chip level scan enable signal, and SHC is the scan hold control signal.

10. The method as claimed in claim 9, wherein the scan hold control signal and the diagnose enable signal are provided by a TAP controller.

11. The circuit as claimed in claim 7, wherein the BISR scan chain is connected in a signal scan chain separates from logic forming other scan chains, and wherein the BISR scan chain is activated when required.

12. The circuit as claimed in claim 7, wherein the BISR scan chain is multiplexed with a normal scan chain.

13. The circuit as claimed in claim 12, wherein when the diagnose enable signal is low the BISR scan chain is bypassed by the scan test and wherein when the diagnose enable signal is high, the BISR scan chain is put in the scan test path.

14. A memory employing a Built In Self Repair circuit and having a scan test as a part of a custom test flow, comprising:

a circuit for protecting the values stored in a BISR repair block, including:

an array of memory elements;

a BISR circuit for providing testing and soft repair of a memory element within the array;

a plurality of soft latches controlled by the BISR circuit, the soft latches being coupled together to form a BISR scan chain for holding BISR repair information; and circuitry for providing a test enable signal, comprising:

a chip level scan enable pin for a signal enabling a scan test, a scan hold control pin for a signal controlling holding of the repair information in the soft latches of the BISR scan chain, a BISR scan pin for a BISR scan signal suitable for causing the scan test to be run and a diagnose enable pin for a diagnose enable signal for enabling debugging of logic connecting the BISR scan chains, wherein the signal enabling a scan test and the signal controlling holding of the repair information cooperate to control connection of the BISR scan chain to other scan chains during a scan test, whereby the BISR repair information is held within the soft latches.

15. The memory as claimed in claim 14, wherein the chip level scan enable signal and the scan hold control signal cooperate to prevent the BISR scan chain from be connected with other scan chains.

16. The memory as claimed in claim 14, wherein the diagnose enable signal cooperates with the chip level scan enable signal and the scan hold control signal for enabling debugging of logic connecting the BISR scan chains.

17. The memory as claimed in claim 16, wherein the BISR scan chain is connected in a single scan chain separate from logic forming other scan chains, and wherein the BISR scan chain is activated when required.

18. The memory as claimed in claim 16, wherein the BISR scan chain is multiplexed with a normal scan chain.

19. The memory as claimed in claim 18, wherein when the diagnose enable signal is low the BISR scan chain is bypassed by the scan test and wherein when the diagnose enable signal is high, the BISR scan chain is put in the scan test path.

20. The memory as claimed in claim 14, wherein the chip level scan enable signal, the scan hold control signal, the diagnose enable signal and the BISR scan signal are combined to provide a test enable signal for controlling connection of the BISR scan chain to other scan chains during a scan test.

21. The memory as claimed in claim 20, wherein the test enable signal may be determined by the expression

TE=BS·DE·CLSE·SHC+DE·CLSE·SHC wherein TE is the test enable signal, BS is the BISR scan signal, DE is the diagnose enable signal, CLSE is the chip level scan enable signal, and SHC is the scan hold control signal.

22. A memory employing a Built In Self Repair circuit and having a scan test as a part of a custom test flow, comprising:

a circuit for protecting the values stored in a BISR repair block, including:

an array of memory elements;

a BISR circuit for providing testing and soft repair of a memory element within the array;

a plurality of soft latches controlled by the BISR circuit, the soft latches being coupled together to form a BISR scan chain for holding BISR repair information; and circuitry for providing a test enable signal, including:

a chip level scan enable pin for receiving a signal enabling a scan test, a scan hold control pin for receiving a signal controlling holding of the repair information in the soft latches of the BISR scan chain, a BISR scan pin for receiving a BISR scan signal suitable for causing the scan test to be run and a diagnose enable pin for receiving a diagnose enable signal for enabling debugging of logic connecting the BISR scan chains, wherein the test enable signal being determined by the expression

TE=BS·DE·CLSE·SHC+DE·CLSE·SHC wherein TE is the test enable signal, BS is the BISR scan signal, DE is the diagnose enable signal, CLSE is the chip level scan enable signal, and SHC is the scan hold control signal.

23. The memory as described in claim 22, wherein the chip level scan enable signal and the scan hold control signal cooperate to control connection of the BISR scan chain to other scan chains during a scan test, so that the BISR repair information is held within the soft latches.

24. The memory as claimed in claim 22, wherein the BISR scan chain is connected in a single scan chain separate from logic forming other scan chains, and wherein the BISR scan chain is activated when required.

25. A method for protecting the values stored in a BISR repair block in an integrated circuit having a custom test flow, comprising:

storing repair information in a plurality of soft latches within the BISR repair block, the soft latches being coupled together to form a BISR scan chain for holding the BISR repair information;

providing a chip level scan enable signal for enabling a scan test;

providing a scan hold control signal for controlling holding of the repair information in the soft latches of the BISR scan chain;

providing a BISR scan signal suitable for causing the scan test to be run;

providing a diagnose enable signal, the diagnose enable signal cooperating with the chip level scan enable signal and the scan hold control signal for enabling debugging of logic connecting the BISR scan chains;

providing a test enable signal, wherein the chip level scan enable signal, the scan hold control signal, the diagnose enable signal and the BISR scan signal are combined to provide a test enable signal for controlling connection of the BISR scan chain to other scan chains during a scan test.

26. The method as described in claim 25, wherein the chip level scan enable signal and the scan hold control signal cooperate to control connection of the BISR scan chain to other scan chains during a scan test whereby the BISR repair information is held within the soft latches and said scan test is any part of said custom test flow employing BISR circuit.

27. The method as claimed in claim 25, wherein the chip level scan enable signal and the scan hold control signal cooperate to prevent the BISR scan chain from being connected to other scan chains.

28. The circuit as claimed in claim 25, wherein the BISR scan chain is connected in a single scan chain separate from logic forming other scan chains, and wherein the BISR scan chain is activated when required.

29. The method as claimed in claim 25, wherein the test enable signal is determined by expression $$TE = BS \cdot DE \cdot CLSE \cdot SHC + DE \cdot CLSE \cdot SHC$$

wherein TE is the test enable signal, BS is the BISR scan signal, DE is the diagnose enable signal, CLSE is the chip level scan enable signal, and SHC is the scan hold control signal.

30. The method as claimed in claim 25, wherein when the diagnose enable signal is low the BISR scan chain is bypassed by the scan test and wherein when the diagnose enable signal is high, the BISR scan chain is put in the scan test path.

* * * * *